United States Patent [19]

Rohde et al.

[11] Patent Number: 5,011,755
[45] Date of Patent: Apr. 30, 1991

[54] PHOTOINITIATOR MIXTURES CONTAINING A TITANOCENE AND A 3-KETOCOUMARIN

[75] Inventors: Ottmar Rohde, Basel; Armin Schaffner, Cudrefin; Martin Riediker, Riehen; Kurt Meier, Binningen, all of Switzerland

[73] Assignee: Ciba-Geigy Corporation, Ardsley, N.Y.

[21] Appl. No.: 473,135

[22] Filed: Jan. 30, 1990

Related U.S. Application Data

[63] Continuation of Ser. No. 145,431, Jan. 19, 1988, abandoned.

[30] Foreign Application Priority Data

Feb. 2, 1987 [CH] Switzerland ............... 360/87

[51] Int. Cl.$^5$ ............... G03F 7/038; G03F 7/30; G03F 7/38; G03F 7/40
[52] U.S. Cl. ............... 430/18; 522/16; 522/18; 522/17; 522/26; 522/29; 430/906; 430/924; 430/947; 430/919; 430/281; 430/283; 430/286; 430/325; 430/330; 430/327; 502/5; 502/522; 502/152; 502/155; 502/156
[58] Field of Search ............... 522/16, 18, 17, 26, 522/29; 430/906, 924, 947, 919, 281, 283, 286, 325, 330, 18, 327; 502/5, 522, 152, 155, 156

[56] References Cited

U.S. PATENT DOCUMENTS

| | | | |
|---|---|---|---|
| 4,147,552 | 4/1979 | Specht et al. | 96/115 R |
| 4,349,619 | 9/1982 | Kamoshida et al. | 430/311 X |
| 4,548,891 | 10/1985 | Riediker et al. | 430/283 |
| 4,590,287 | 5/1986 | Riediker et al. | 556/53 |
| 4,713,401 | 12/1987 | Riediker et al. | 522/65 |

FOREIGN PATENT DOCUMENTS

0024342  3/1981  Japan ............... 430/286

Primary Examiner—Cynthia Hamilton
Attorney, Agent, or Firm—Luther A. R. Hall

[57] ABSTRACT

The present invention relates to compositions comprising (a) a titanocene photoinitiator of the formula I

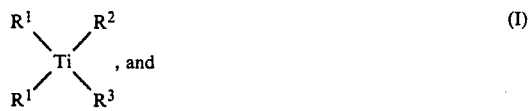

, and (b) a 3-ketocoumarin of the formula II

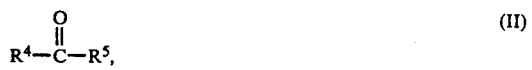

in which both $R^1$, $R^2$ and $R^3$ are as defined in claim 1, $R^4$ is a radical of the formula V

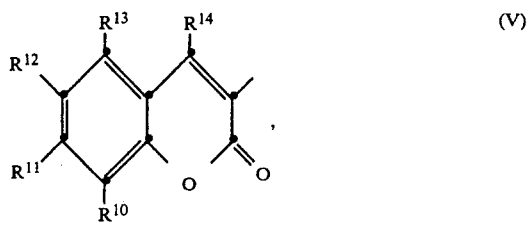

$R^5$ is $C_1$-$C_{20}$alkyl, cycloalkyl having 5-7 ring carbon atoms, phenyl or naphthyl which are unsubstituted or substituted by one to three $C_1$-$C_6$alkyl groups, $C_1$-$C_6$alkoxy groups or halogen atoms or by one diphenylamino or $C_1$-$C_6$dialkylamino group, or is $C_7$-$C_9$aralkyl, a radical —(CH=CH)$_a$—$C_6H_5$ or a radical of the formula V, a is 1 or 2, preferably 1, and $R^{10}$, $R^{11}$, $R^{12}$, $R^{13}$ and $R^{14}$ independently of one another are hydrogen, $C_1$-$C_6$alkyl, $C_1$-$C_6$alkoxy, phenyl, tolyl, xylyl or benzyl, and $R^{11}$ can additionally also be a group —$NR^{15}R^{16}$ or —$OR^{15}$, wherein $R^{15}$ and $R^{16}$ independently of one another are hydrogen or $C_1$-$C_6$alkyl, it also being possible for two or three of the radicals $R^{10}$, $R^{11}$, $R^{12}$ and $R^{13}$ together with the ring carbon atoms, to which they are attached, to form a fused ring having 5 or 6 ring atoms or a fused ring system having 5-membered or 6-membered rings. The photoinitiator mixtures can be used in combination with ethylenically unsaturated monomers, preferably with photopolymerizable precursors of thermally stable polymers. These mixtures can be processed especially on substrates having surfaces which are strongly scattering or strongly reflecting, to give relief structures with high resolution.

18 Claims, No Drawings

PHOTOINITIATOR MIXTURES CONTAINING A TITANOCENE AND A 3-KETOCOUMARIN

This is a continuation of application Ser. No. 145,431, filed on Jan. 19, 1988, now abandoned.

The present invention relates to photoinitiator mixtures containing a titanocene and a 3-ketocoumarin, to radiation-sensitive compositions containing an ethylenically unsaturated monomer and said photoinitiator mixture, to a process for producing thermally stable coatings or relief images and to the use of said compositions in imaging processes on scattering or strongly reflecting substrates.

Titanocene initiators for the photopolymerization of ethylenically unsaturated compounds have been disclosed by EP-A Nos. 122,233 and 186,626. According to EP-A No. 186,626, the light sensitivity of selected titanocene initiators can be enhanced by the addition of conventional sensitizers, for example mono- or polycyclic hydrocarbons, phenones, xanthones or thioxanthones.

Radiation-sensitive coatings containing crosslinkable polymer precursors, selected titanocene initiators and, if appropriate, a low-molecular co-monomer unit are known from EP-A No. 119,162. According to the description, conventional additives such as sensitizers or initiators can be added to these compositions.

Coumarins substituted in the 3-position, also including 3-ketocoumarins, and their use for sensitizing light-sensitive compounds are known from German Offenlegungsschrift No. 2,704,368.

In the photopolymerization using titanocene initiators, a scattering problem arises on reflecting or strongly light-scattering substrates, for example on metal or ceramic substrates, i.e. the resolution is greatly reduced by reflected or scattered light, since light penetrates into the geometrical shadow regions and, in the latter, effects crosslinking of the radiation-sensitive polymers.

It has now been found that this scattering problem can be solved by adding 3-ketocoumarins in a relatively low concentration, without reducing the high photosensitivity of the system.

Moreover, by adding 3-ketocoumarins in varying quantities, the so-called edge angle of relief structures can be influenced, which is as a rule not possible if the titanocene initiator is used alone. Furthermore, an increase in the general photosensitivity, relative to the titanocene system, can be observed in the case of thin layers.

The present invention relates to compositions comprising (a) a titanocene photoinitiator of the formula I

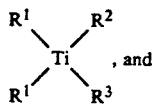, and (b) a 3-ketocoumarin of the formula II

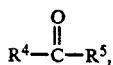

in which both $R^1$ independently of one another are unsubstituted or $C_1$–$C_6$-alkyl- or $C_1$–$C_6$alkoxy-substituted cyclopentadienyl$^\ominus$, indenyl$^\ominus$ or 4,5,6,7-tetrahydroindenyl$^\ominus$ or together are a radical of the formula III

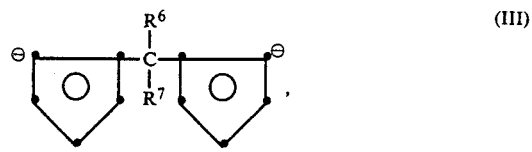

$R^6$ and $R^7$ independently of one another being hydrogen or methyl, $R^2$ is a 6-membered carbocyclic aromatic ring or a 5-membered or 6-membered heterocyclic aromatic ring, which in at least one of the two ortho-positions relative to the metal-carbon bond is substituted by a fluorine atom or a —$CF_2R$ group, R being a fluorine atom or methyl, $R^3$ is as defined for $R^2$ or, additionally, can be halogen, pseudohalogen, —$OR^8$ or —$SR^9$, $R^8$ being hydrogen, $C_1$–$C_6$alkyl, phenyl, acetyl or trifluoroacetyl and $R^9$ being $C_1$–$C_6$alkyl or phenyl, or $R^2$ and $R^3$ together form a radical of the formula IV

in which Q is a 6-membered carbocyclic aromatic radical or 5-membered or 6-membered heterocyclic aromatic radical, the two bonds each being in the ortho-position relative to the bridge Y and each meta-position relative to the bridge Y being substituted by a fluorine atom or a —$CF_2R$ group, and Y is a direct bond, —O—, —S—, —$SO_2$—, —CO—, —$CH_2$— or —$C(CH_3)_2$—, $R^4$ is a radical of the formula V

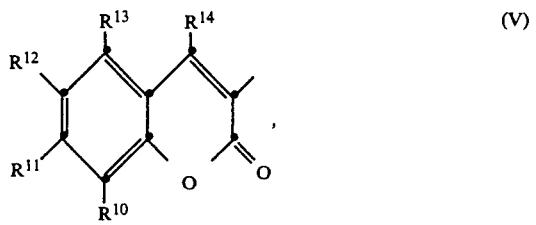

$R^5$ is $C_1$–$C_{20}$alkyl, cycloalkyl having 5–7 ring carbon atoms, phenyl or naphthyl which are unsubstituted or substituted by one to three $C_1$–$C_6$-alkyl groups, $C_1$–$C_6$alkoxy groups or halogen atoms or by one diphenylamino group or $C_1$–$C_6$dialkylamino group, or is $C_7$–$C_9$aralkyl, a radical —(CH=CH)$_a$—$C_6H_5$ or a radical of the formula V, a is 1 or 2, preferably 1, and $R^{10}$, $R^{11}$, $R^{12}$, $R^{13}$ and $R^{14}$ independently of one another are hydrogen, $C_1$–$C_6$alkyl, $C_1$–$C_6$alkoxy, phenyl, tolyl, xylyl or benzyl and $R^{11}$ can additionally also be a group —$NR^{15}R^{16}$ or —$OR^{15}$, wherein $R^{15}$ and $R^{16}$ independently of one another are hydrogen or $C_1$–$C_6$-alkyl, it also being possible for two or three of the radicals $R^{10}$, $R^{11}$, $R^{12}$ and $R^{13}$ together with the ring carbon atoms, to which they are attached, to form a fused ring having 5 or 6 ring atoms or a fused ring system having 5-membered or 6-membered rings.

The substituted radical $R^1$ carries $C_1$–$C_6$alkyl or $C_1$–$C_6$alkoxy radicals. The substituents can be straight-chain or branched. Straight-chain substituents are preferred. Examples of substituents are methyl, ethyl, n-propyl, sec-propyl, n-butyl, sec-butyl, n-pentyl, n-hexyl, methoxy, ethoxy, n-propoxy, sec-propoxy, n-butoxy, sec-butoxy, n-pentyloxy or n-hexyloxy. Methyl or methoxy, especially methyl, are preferred.

The substituted radical $R^1$ preferably carries one or two substituents, but with very particular preference one substituent.

Preferred radicals $R^1$ are the unsubstituted types. Examples of very particularly preferred radicals $R^1$ are cyclopentadienyl or methylcyclopentadienyl.

$R^6$ and $R^7$ preferably are both hydrogen or both methyl, and especially both are hydrogen.

A 6-membered carbocyclic aromatic ring $R^2$ is, for example, indene, indane, fluorene, naphthalene and especially phenyl. According to the definition, this ring must carry a fluorine substituent in at least one ortho-position relative to the metal-carbon bond. Preferably, this is a fluorine atom or $-CF_3$. Preferably, both ortho-positions relative to the metal-carbon bond are substituted by a fluorine substituent.

Examples of preferred groups $R^2$ are 4,6-difluoroinden-5-yl, 4,6-bis-(trifluoromethyl)-inden-5-yl, 5,7-difluoroind-6-yl, 5,7-bis-(trifluoromethyl)-ind-6-yl, 2,4-difluorofluoren-3-yl, 2,4-bis-(trifluoromethyl)-fluoren-3-yl, 1,3-difluoronaphth-2-yl, 1,3-bis-(trifluoromethyl)-naphth-2-yl and very particularly 2,6-difluorophen-1-yl and 2,6-bis-(trifluoromethyl)-phen-1-yl.

A heterocyclic aromatic 5-membered ring $R^2$ preferably contains one hetero atom and a 6-membered ring preferably contains one or two hetero atoms. Examples of such rings substituted by fluorine atoms or $-CF_2R$ groups, especially $-CF_3$ groups, are 2,4-difluoropyrr-3-yl, 2,4-bis-(trifluoromethyl)-pyrr-3-yl, 2,4-difur-3-yl, 2,4-bis-(trifluoromethyl)-fur-3-yl, 2,4-difluorothiophen-3-yl, 2,4-bis-(trifluoromethyl)-thiophen-3-yl, 2,4-difluoropyrid-3-yl, 2,4-bis-(trifluoromethyl)-pyrid-3-yl, 4,6-difluoropyrimid-5-yl or 4,6-bis-(trifluoromethyl)-pyrimid-5-yl.

Halogen $R^3$ is fluorine, chlorine, bromine or iodine. Chlorine or bromine are preferred.

Pseudohalogen $R^3$ is, for example, cyanate, thiocyanate, azide or cyanide.

$C_1-C_6$alkyl radicals $R^8$ or $R^9$ are branched or preferably straight-chain. Examples of these are methyl, ethyl, n-propyl, sec-propyl, n-butyl, sec-butyl, n-pentyl or n-hexyl. Methyl is preferred.

When $R^2$ and $R^3$ together form a radical of the formula IV, these are preferably the groups of the formulae IVa, IVb, IVc, IVd, IVe or IVf

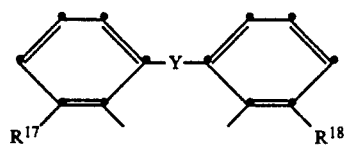
(IVa)

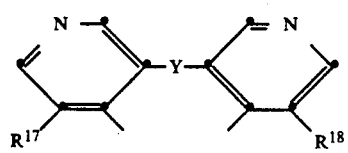
(IVb)

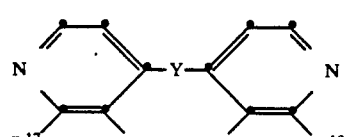
(IVc)

-continued

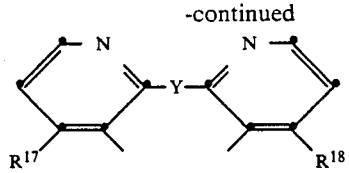
(IVd)

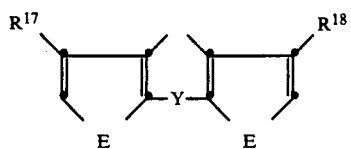
(IVe)

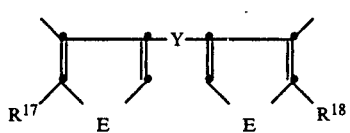
(IVf)

in which $R^{17}$ and $R^{18}$ independently of one another are a fluorine atom or a $-CF_2R$ group as defined above, Y is as defined above and E is $-O-$, $-S-$ or $-NH-$.

A $C_1-C_{20}$alkyl radical $R^5$ is a branched or preferably straight-chain alkyl radical. Examples thereof are methyl, ethyl, n-propyl, sec-propyl, n-butyl, sec-butyl, n-pentyl, n-hexyl, n-heptyl, n-octyl, n-nonyl, n-decyl, n-dodecyl, n-tetradecyl, n-hexadecyl, n-octadecyl or n-eicosyl.

Preferred alkyl radicals $R^5$ are straight-chain and have 1 to 6 C atoms. Methyl is very particularly preferred.

Cycloalkyl $R^5$ having 5-7 ring carbon atoms is cyclopentyl, cyclohexyl or cycloheptyl. Cyclohexyl is preferred.

Examples of alkyl-substituted naphthyl or phenyl groups $R^5$ are o-, m-or p-tolyl, xylyl, ethylphenyl or 2-methylnaphthyl.

Examples of alkoxy-substituted naphthyl or phenyl groups are o-, m- or p-methoxyphenyl, dimethoxyphenyl or 2-methoxynaphthyl.

Examples of halogen-substituted naphthyl or phenyl groups are o-, m-or p-chlorophenyl, dichlorophenyl or 2-chloronaphthyl. Examples of diphenylamino- or dialkylamino-substituted naphthyl or phenyl groups are 4-(N,N-diphenylamino)-phenyl or 2-(N,N-diphenylamino)-naphthyl or the corresponding N,N-dimethylamino derivatives.

Examples of $C_7-C_9$aralkyl are benzyl, α-methylbenzyl or α,α-dimethylbenzyl. Benzyl is preferred.

$C_1-C_6$alkyl or $C_1-C_6$alkoxy groups $R^{10}$ to $R^{14}$ are, for example, the radicals listed above as substituents for $R^1$. Preferably, these radicals are methyl or methoxy.

$C_1-C_6$alkyl groups $R^{15}$ and $R^{16}$ are, for example, the radicals given above for $R^1$. Preferably, these are ethyl, n-propyl, sec-propyl, n-butyl, sec-butyl, n-pentyl or n-hexyl, especially ethyl.

When two or three of the radicals $R^{10}$, $R^{11}$, $R^{12}$ or $R^{13}$ form a 5-membered or 6-membered ring or a ring system, this is as a rule a carbocyclic aromatic or a carbocyclic non-aromatic ring or a ring system. In the case of $R^{11}=-OR^{15}$ or $-NR^{15}R^{16}$, this can also be a heterocyclic ring or a ring system. 6-Membered heterocyclic rings or ring systems are preferred. An example of a radical $R^4$ containing a ring system of this type is

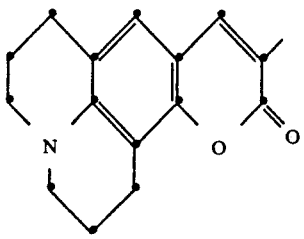

Preferred titanocene initiators are those compounds of the formula I in which the $R^1$ independently of one another are cyclopentadienyl which is unsubstituted or substituted by one or two methyl groups, and $R^2$ and $R^3$ independently of one another are a radical of the formula VI

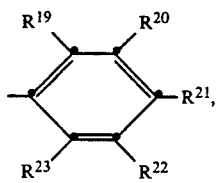

in which $R^{19}$ is a fluorine atom or a —$CF_2R$ group as defined above and $R^{20}$, $R^{21}$, $R^{22}$ and $R^{23}$ independently of one another are a fluorine atom, a —$CF_2R$ group, hydrogen, $C_1$-$C_6$alkyl or $C_1$-$C_6$alkoxy, or $R^2$ and $R^3$ together form a group of the formula IVa as defined above, or $R^3$ can additionally be a chlorine atom or a cyanide group.

Very particularly preferred compositions containing a titanocene of the formula I in which $R^1$ and $R^2$ independently of one another are cyclopentadienyl or methylcyclopentadienyl and $R^3$ and $R^4$ independently of one another are a radical of the formula VII

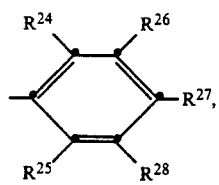

in which $R^{24}$ and $R^{25}$ independently of one another are a fluorine atom or a —$CF_3$ group and $R^{26}$, $R^{27}$ and $R^{28}$ independently of one another are hydrogen, a fluorine atom or a —$CF_3$ group.

Preferred compositions contain 3-ketocoumarins of the formula II, in which the groups $R^{10}$, $R^{12}$ and $R^{13}$ are hydrogen, $R^{11}$ is hydrogen, —$NR^{15}R^{16}$ or —$OR^{15}$, $R^{14}$ is hydrogen or methyl and $R^5$ is $C_1$-$C_{12}$alkyl, cyclohexyl, phenyl, tolyl or benzyl.

Very particularly preferred compositions contain 3-ketocoumarins of the formula II, in which the groups $R^{10}$, $R^{12}$, $R^{13}$ and $R^{14}$ are hydrogen, $R^{11}$ is —$NR^{15}R^{16}$, preferably —$N(C_1$-$C_6$alkyl$)_2$, especially —$N(C_2H_5)_2$, and $R^5$ is a radical of the formula V or phenyl.

Ethylenically unsaturated monomers or prepolymers can be photopolymerized by means of the titanocene/3-ketocoumarin mixtures. Examples of photopolymerizable monomer units or prepolymer units are given in the abovementioned EP-A relating to titanocene initiators.

In a particularly preferred embodiment of this invention, the photoinitiator mixtures are employed in the polymerization of polymeric precursors of thermally stable polymers.

The invention therefore relates in particular to compositions comprising (a) a titanocene of the formula I as defined above, (b) a 3-ketocoumarin of the formula II as defined above and (c) a polymer precursor which has identical or different recurring structural units of the formula VIII

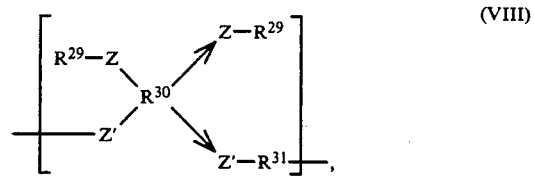

and reacts on heating to give a thermally stable ring structure, in which formula $R^{29}$ is a radical having a photopolymerizable olefinic double bond, $R^{30}$ is a tetravalent aromatic radical after the removal of the four functional groups, two functional groups in each case being adjacent and the arrows representing structural isomerism, $R^{31}$ is a divalent aliphatic, cycloaliphatic or mononuclear or polynuclear aromatic radical, it being possible for aromatic radicals $R^{31}$ to carry one of the groups —$CONH_2$ or —$COOH$ in the ortho-position relative to bond $Z'$, the $Z$ are a covalent or ionic bond element and the $Z'$ are a covalent bond element, with the proviso that, on heating of the photopolymerizable composition, $Z$ and $Z'$, if appropriate together with —$CONH_2$ or —$COOH$ groups contained in $R^{31}$, give a thermally stable ring structure, with elimination of $R^{29}$.

In the polymer precursors (c), the $R^{29}$, $R^{30}$, $R^{31}$, $Z$ and $Z'$ radicals in the individual structural elements can be identical or different. In the case of copolymers, the individual structural elements can be in a random arrangement, or they can be blocked copolymers which can be prepared by linking different blocks according to methods known per se. If $Z$ is an ionic bond element, cyclized derivatives obtained from structural elements of the formula VIII can also be linked to polymer precursors having recurring structural elements.

The mean molecular weight ($\overline{M}_w$) of the polymer precursors is preferably 5,000 to 100,000, especially 5,000 to 50,000 and very particularly 10,000 to 30,000. The mean molecular weights can be determined and compared, for example, by taking gel permeation chromatograms with polystyrene calibration.

Aromatic radicals $R^{30}$ can be mononuclear or polynuclear and may also be substituted, for example by halogen atoms, alkyl or alkoxy groups each having 1–4 C atoms. $R^{30}$ is, for example, a naphthalene, phenanthrene or perylene radical and especially a radical of the formula IX or X

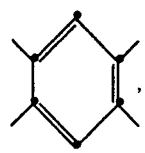

-continued

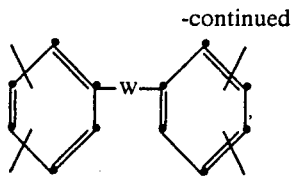
(X)

in which W is a direct bond, —O—, —CO—, —CH₂—, —C(CF₃)₂—, —S—, —SO₂—, —NH— or alkylidene having 2-12 C atoms. With particular preference, $R^{30}$ is the radical of pyromellitic dianhydride, a benzophenonetetracarboxylic dianhydride or a mixture thereof.

An aliphatic radical $R^{31}$ preferably contains 2-20 C atoms and can, for example, be linear or branched alkylene which can be interrupted by silane or siloxane groups. A cycloaliphatic radical $R^{31}$ preferably contains 5-7 ring carbon atoms and is especially cyclohexylene, cyclopentylene or the radical of isophoronediamine. Preferably, $R^{31}$ is an aromatic radical which especially has 6-16 C atoms and may also be substituted, for example by halogen atoms, OH, —COOH, —CONH₂ or alkyl or alkoxy groups having 1-4 C atoms.

With particular preference, $R^{31}$ is a radical of the formulae XI, XII or XIII

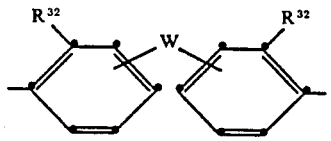
(XI)

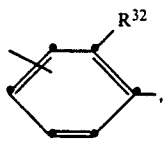
(XII)

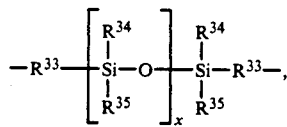
(XIII)

in which W is as defined above and especially is —O—, —CH₂— or —C(CF₃)₂—, x is an integer from 1 to 10, in particular 1 to 5 and especially 1, the radicals $R^{32}$ independently of one another are a hydrogen atom, —CONH₂ or —COOH, $R^{33}$ is —$C_pH_{2p}$— with p=1 to 5 and $R^{34}$ and $R^{35}$ independently of one another are straight-chain or branched alkyl having 1-6 C atoms, especially methyl. Radicals bound in the paraposition or 4,4′-position are preferred as radicals of the formulae XI and XII.

The group $R^{29}$ is preferably of the formula XIV

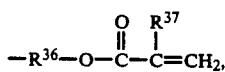
(XIV)

in which $R^{36}$ is —$C_mH_{2m}$— with m=2-12, such as ethylene, 1,2- or 1,3-propylene, 1,2-, 1,3- or 1,4-butylene, n-pentylene, n-hexylene, n-octylene or n-dodecylene, —CH₂CH(OH)CH₂— or polyoxaalkylene having 4-30 C atoms, such as the radicals of diethylene glycol, triethylene glycol, tetraethylene glycol, polyethylene glycol, dipropylene glycol or polypropylene glycol, and $R^{37}$ is a hydrogen atom or methyl.

In the case of Z=—COO—, $R^{29}$ can also be —CH=CH₂, —CH₂CH=CH₂ or —CH₂C(CH₃)=CH₂.

$R^{36}$ is preferably ethylene, 1,2- or 1,3-propylene or —CH₂CH(OH)CH₂— and $R^{37}$ is especially methyl.

Those polymer precursors (c) are preferred in which $R^{31}$ is a radical of the formula XI in 0-100% of the recurring structural elements and a radical of the formula XII in 100-0% of the recurring structural elements, and also polymer precursors in which $R^{31}$ is a radical of the formula XI and/or XII in 70-100% of the recurring structural elements and a radical of the formula XIII in 30-0% of the recurring structural elements.

According to the definition, Z can be a covalent or ionic bond. Ionic bonds can especially be those between carboxyl groups and tertiary amines. Preferably, Z is —COO—, —CONH—, —O—, —NH—, —COOH/NR³⁸R³⁹— or

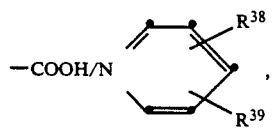

in which $R^{38}$ and $R^{39}$ independently of one another are alkyl or alkenyl having up to 6 C atoms, especially methyl in each case.

Z′ preferably is —CONH—, —NHCO—, —NH—CO—NH— or —O—CO—NH—.

With particular preference, Z is —CONH—, —COO— or —COOH/N(CH₃)₂— and Z′ is —CONH—, or Z is —O— and Z′ is —NHCO—.

According to the definition, the groups Z and Z′ must, on heating, give thermally stable ring structures, if appropriate together with —CONH₂ or —COOH groups contained in $R^{31}$, with elimination of the groups $R^{29}$. Depending on the nature of the groups Z and Z′ respectively, these can be the following ring structures ($R^{30}$=

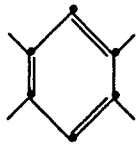

and $R^{31}$=an aromatic radical Ar which can also be a constituent of the ring structure):

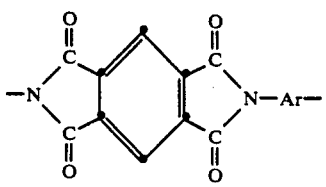

[A, polyimides],

-continued

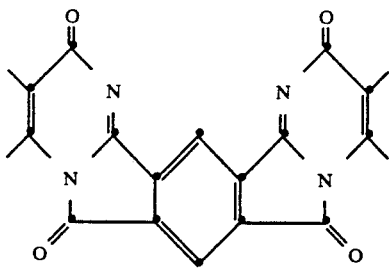

[B, poly-(isoindoloquinazolidinediones)],

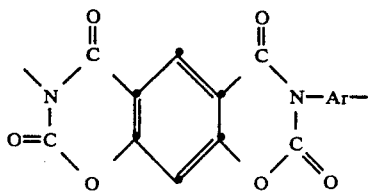

[C, poly-(oxazinediones)],

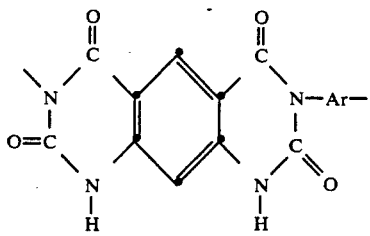

[D, poly-(quinazolinediones)],

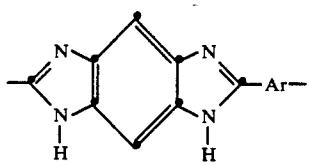

[E, poly-(imidazoles)],

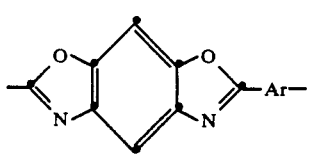

[F, poly-(oxazoles)], and

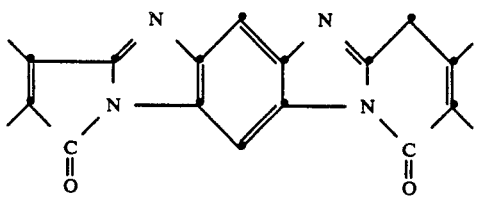

[G, poly-(imidazopyrrolones)].

These ring structures and the corresponding prepolymers can be prepared, for example, as described in EP-A No. 119,162.

Polymer precursors having recurring structural elements of the formula VIIIa

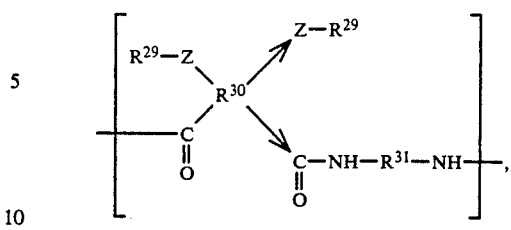

(VIIIa)

in which $R^{30}$ is the tetravalent radical of an aromatic tetracarboxylic acid after the removal of four carboxyl groups and $R^{31}$, $R^{29}$ and Z are as defined under the formula VIII, are particularly preferred. In this case, Z is preferably —CO—O—.

Furthermore, polymer precursors having recurring structural elements of the formula VIIIb

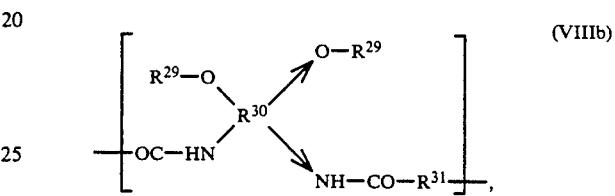

(VIIIb)

in which $R^{30}$ is the radical of 3,3'-dihydroxybenzidine, the $R^{31}$ radicals in the individual recurring structural elements independently of one another are the radical of isophthalic acid or 4,4'-benzophenonedicarboxylic acid and $R^{29}$ is as defined under the formula VIII, are preferred.

The structural isomerism indicated by an arrow can be illustrated as follows, taking pyromellitic acid as an example (Z=—CO—O—):

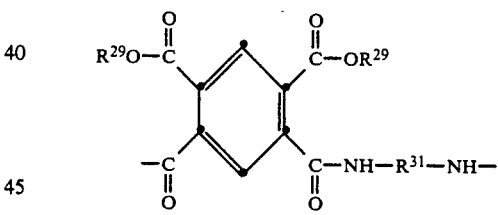

or

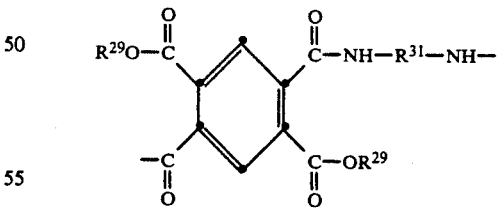

The polymer precursors (c) are known or can be prepared by methods known per se (cf., for example, the reaction scheme in EP-A No. 119,162 and U.S. Pat. Nos. 4,329,419 and 4,030,948).

Compounds suitable for preparing the polymer precursors (c) are mentioned, for example, in EP-A No. 119,162 and are likewise the subject of the present description.

Those compositions are particularly preferred in which the polymer precursor (c) consists of recurring structural elements of the formula VIIIc

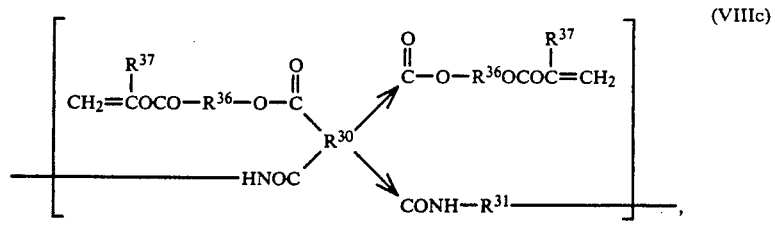
(VIIIc)

in which R³⁰ is the radical of pyromellitic dianhydride, a benzophenonetetracarboxylic dianhydride or a mixture of such radicals, the R³¹ radicals in the individual recurring structural elements independently of one another are 1,3- or 1,4-phenylene, the radical of 4,4'-diaminodiphenyl ether, of 4,4'-diaminodiphenylmethane, of 2,2-bis-(4-aminophenyl)-hexafluoropropane, of 4,4'-diamino-3-carbonamidodiphenyl ether or of 4,4'-diamino-3,3'-bis-carbonamidobiphenyl, R³⁶ is —CH₂CH₂— or —CH₂CH(OH)—CH₂— and R³⁷ is a hydrogen atom or methyl, and also the compositions in which the polymer precursor (c) consists of recurring structural elements of the formula VIIId

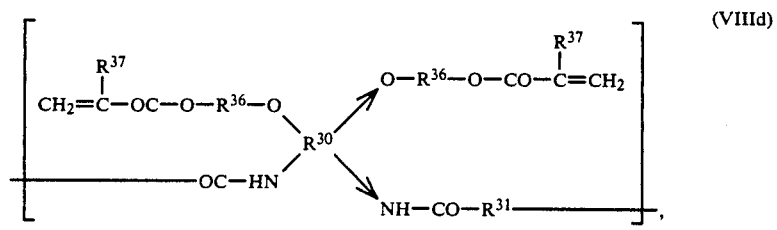
(VIIId)

in which R³⁰ is the radical of 3,3'-dihydroxybenzidine, the R³¹ radicals in the individual recurring structural elements independently of one another are 1,3-phenylene or the radical of 4,4'-benzophenonedicarboxylic acid, R³⁶ is —CH₂CH₂—, —CH₂CH₂—CH₂— or —CH₂CH(OH)—CH₂— and R³ is a hydrogen atom or methyl.

Polymer precursors having recurring structural elements of the formulae VIIIe to VIIIk should be mentioned specifically:

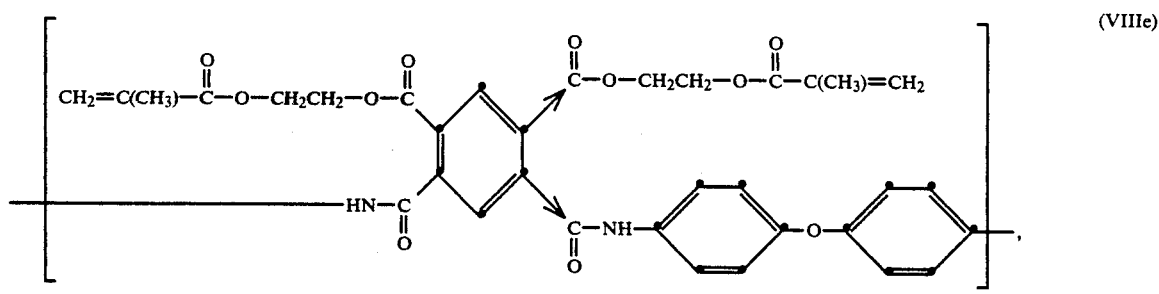
(VIIIe)

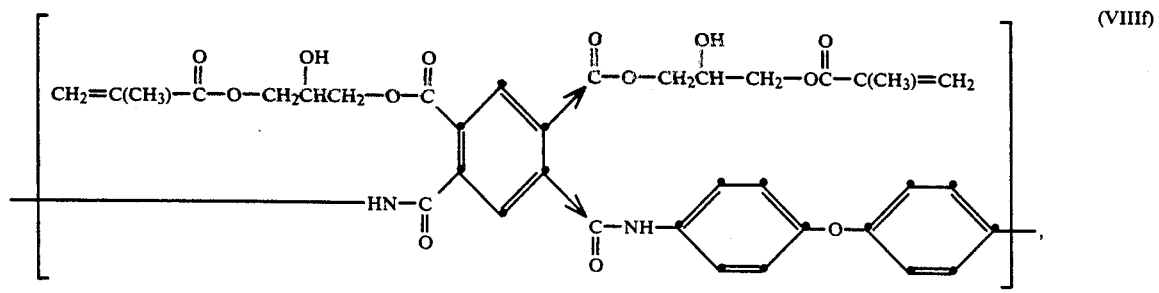
(VIIIf)

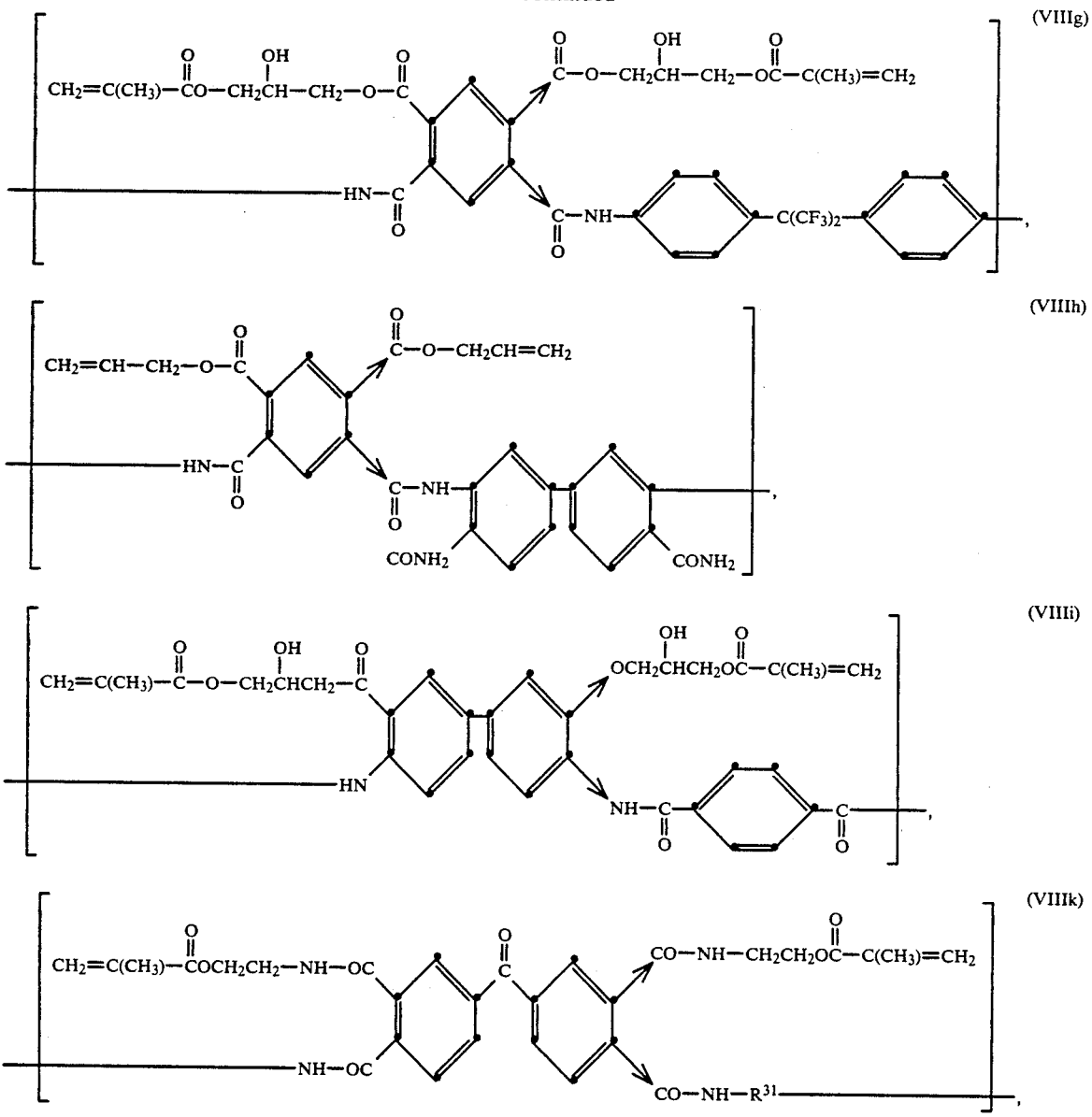

in which $R^{31}$ is

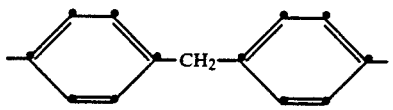

in 70% of the structural elements and

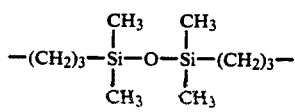

in 30% of the structural elements.

The photopolymerizable compositions according to the invention preferably also contain a selected low-molecular cocomponent (d).

The invention therefore preferably relates to compositions comprising the components (a), (b) and (c) as defined above and additionally (d) which is an acrylic acid ester, methacrylic acid ester, allyl ether or allyl ester or partial ester of these acids with a polyol.

The additional use of this component (d) leads as a rule to a considerable increase in the light sensitivity of the photopolymerizable composition and thus to a shortening of the required exposure time.

Possible components (d) are, for example, ethers according to the definition and especially esters and partial esters of (meth)acrylic acid and aromatic and especially aliphatic polyols having in particular 2-30 C atoms or cycloaliphatic polyols preferably having 5 or 6 ring carbon atoms. These polyols can also be modified with epoxides, such as ethylene oxide or propylene oxide. The partial esters and esters of polyoxaalkylene glycols are also suitable. The following are examples of components (d): ethylene glycol dimethacrylate, diethylene glycol dimethacrylate, triethylene glycol dimethacrylate, tetraethylene glycol dimethacrylate, polyethylene glycol dimethacrylates of a mean molecular weight in the range of 200-2,000, ethylene glycol diacrylate, diethylene glycol diacrylate, triethylene glycol diacrylate, tetraethylene glycol diacrylate, polyethylene glycol diacrylates of a mean molecular weight in the range of 200–2,000, trimethylolpropane ethoxylate trimethacrylate, trimethylolpropane polyethoxylate trimethacrylates of a mean molecular weight in the range of 500–1,500, trimethylolpropane ethoxylate triacrylates of a mean molecular weight of 500–1,500, pentaerythritol diacrylate, pentaerythritol triacrylate, pentaerythritol tetraacrylate, dipentaerythritol diacrylate, dipentaerthritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol diacrylate and glycerol triacrylate, 1,4-cyclohexane diacrylate, bisacrylates and bismethacrylates of polyethylene glycols of a mean molecular weight of 100–1,500, ethylene glycol diallyl ether, diallyl succinate and diallyl adipate or mixtures of the compounds mentioned.

The titanocene initiator (a) and the 3-ketocoumarin (b) are as a rule employed in quantities of 10:1 to 0.5:1 parts by weight. Preferably, the component (a)/component (b) weight ratio is 5:1 to 1:1 and very particularly preferably 4:1 to 2:1. The photopolymerizable composition contains as a rule 0.1–10% by weight of component (a), 0.01–5% by weight of component (b) and 99.89–85.0% by weight of component (c) and, if appropriate, (d); the percentage data here relate to the quantity of (a), (b), (c) and, if appropriate, (d).

Preferably, the photopolymerizable composition contains 0.2–5.0% by weight of component (a), 0.1–3.0% by weight of component (b) and 99.7–92.0% by weight of component (c), and, if appropriate, (d).

The quantitative ratios of the photopolymerizable prepolymer component (c) and the low-molecular comonomer unit (d) are preferably 10:1 to 1:1 and with very particular preference 5:1 to 1:1 parts by weight.

The photopolymerizable composition according to the invention can contain further conventional additives, for example stabilizers, especially inhibitors for thermal polymerization, such as thiodiphenylamine and alkylphenols, for example 4-tert-butylphenol, 2,5-ditertbutylhydroquinone or 2,6-di-tert-butyl-4-methylphenol.

Furthermore, the composition can contain additional initiators and sensitizers, for example aromatic ketones, such as tetramethyldiaminobenzophenone, benzophenone, Michler's ketone [4,4'-bis-(dimethylamino)-benzophenone], 4,4'-bis-(diethylamino)-benzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzyl dimethylketal and other aromatic ketones, for example according to U.S. Pat. No. 3,552,973; benzoin, benzoin ethers such as benzoin methyl ether, benzoin ethyl ether, benzoin isobutyl ether and benzoin phenyl ether, methylbenzoin, ethylbenzoin and other benzoins; p-maleimidobenzenesulphonic acid azide, thioxanthone derivatives such as thioxanthone, 2-chlorothioxanthone, 2-isopropylthioxanthone, ethyl thioxanthone-1-carboxylate, ethyl 3-methoxythioxanthone-1-carboxylate in conjunction with aromatic amines, such as ethyl p-dimethylaminobenzoate and 4,4'-bis-(dimethylamino)-benzophenone; and bisazides such as 2,6-(4'-azidobenzylidene)-4-methylcyclohexan-1-one.

Further additives are solvents which can be used alone or in combinations, such as N-methylpyrrolidone, butyrolactone, ethylene glycol monoethyl ether, dimethylformamide, dimethylacetamide and hexamethylphosphorotriamide; pigments, dyes, fillers, adhesion promoters, wetting agents and plasticizers, as well as dyes which, by means of their characteristic absorption, can influence the spectral sensitivity of the mixtures.

The compositions according to the invention are prepared by mixing of the components in apparatus conventional for this purpose.

The photopolymerizable compositions according to the invention are outstandingly suitable as coating agents for substrates of any type, for example ceramics, metals such as copper and aluminium, metalloids and semiconductor materials such as silicon, germanium and GaAs, and insulator layers such as $SiO_2$ and $Si_3N_4$ layers, to which a protective layer or a photographic image is to be applied by photopolymerization.

The coated substrates can be produced, for example, by preparing a solution or suspension of the composition, the choice of solvent and the concentration depending mainly on the type of composition and on the coating process, and uniformly applying the solution or suspension to a substrate, for example by whirler-coating, dipping, knife-coating, curtain coating methods, brushing, spraying and reverse-roll coating.

As is known, the photopolymerization of (meth)acrylates and similar olefinically unsaturated compounds is inhibited by atmospheric oxygen, especially in thin layers. This effect can be diminished by known conventional methods, for example application of a temporary covering layer of polyvinyl alcohol or by pre-exposure or pre-conditioning under an inert gas.

After coating, the solvent is removed by drying, and a layer of the light-sensitive polymer on the carrier results. The layer thicknesses are advantageously about 0.05 to 200 μm, preferably 1.0–50 μm. After the imagewise exposure of the material through a photomask, carried out in the conventional manner, the unexposed areas of the polymer are removed by dissolving them out in a developer (solvent), and the polymer relief, consisting of crosslinked polymer according to the invention, is laid bare. Examples of suitable developers are solvents or mixtures of solvents such as N-methylpyrrolidone, N-acetylpyrrolidone, 4-butyrolactone, ethylene glycol monomethyl ether, dimethylformamide, dimethylacetamide, dimethyl sulphoxide and cyclohexanone with nonsolvents such as toluene, xylene, ethanol, methanol or acetone.

The exposure of the compositions according to the invention can be effected by means of a large number of the most diverse light sources. Both point light sources and two-dimensional emitters (lamp carpets) are suitable. Examples are: carbon arc lamps, xenon arc lamps, mercury vapour lamps, if appropriate doped with metal halides (metal halide lamps), fluorescent lamps, incandescent argon lamps, electronic flashlights and photographic floodlights. Those lamps are particularly suitable which have a comparatively high radiation intensity in the spectral region from 400 to 480 nm. The distance between the lamp and the image material according to the invention can vary depending on the application and the type or intensity of the lamp, for example between 2 cm and 150 cm.

By means of the addition of 3-ketocoumarins, the photopolymerizable compositions of this invention can be optically adjusted, i.e. the quantity of light, which is to penetrate down to a defined layer depth at a given light power, can be fixed via the quantity of coinitiator. The photo-sensitivity of the titanocene initiator is not reduced by the 3-ketocoumarin. Images of high resolution can be produced by means of the compositions according to the invention, especially on substrates which are strongly reflecting or strongly scattering.

A substrate having a surface which is strongly reflecting or strongly scattering is in general understood to mean a substrate which reflects or back-scatters at least 20% of the light energy incident on the surface.

The invention also relates to a process for producing images or protective layers, comprising the steps of (i) applying a composition containing components (a), (b), (c) and, if appropriate, (d) as defined above, to a substrate, preferably to a substrate having a surface which is strongly scattering or reflecting, (ii) imagewise exposure of the system, (iii) if necessary a thermal pretreatment, in order to pre-harden the exposed areas, (iv) developing the system and (v) thermally cyclizing component (c).

The invention also relates to the images of protective layers obtainable by the above process.

Very particularly, the invention relates to the use of the photopolymerizable compositions containing components (a), (b), (c) and, if appropriate, (d) in imaging processes on substrates which are strongly scattering or strongly reflecting.

The most important applications are the use as an etch resist, electroplating resist and solder resist in the production of printed circuits and printing plates, the production of photopolymer printing plates for offset printing, letterpress printing, and also in flexographic printing and screen printing as a masking lacquer and for the production of photographic image-recording materials, for example in accordance with DE-A-2,651,864 or DE-A-2,202,360.

The main application is the production of heat- and chemicals-resistant relief structures of, for example, about 0.05 to 200 μm layer thickness on electronic components, such as capacitors, discrete semiconductors, integrated circuits, hybrid circuits, printed circuit boards, liquid crystal displays and photosensors. In particular, the compositions are suitable for use on active components, for example as a passivating protection, especially as α-ray protection for memory components (relatively thick layers) or as a dielectric for multi-layer circuits (thinner layers).

For this application, the materials which have been coated and, if appropriate, exposed imagewise and developed are heat-treated, preferably at temperatures between 300° and 400° C., the conversion into ring structures taking place and volatile constituents being removed, to give images which are stable at high temperatures.

EXAMPLE 1

A photosensitive solution is prepared according to the following formulation, using a polyamide-acid ester corresponding to EP-A No. 119,162, Example 7:

| | |
|---|---:|
| N-Methylpyrrolidone (NMP) | 10.83 g |
| Di-π-methylcyclopentadienyl-Ti-bis-2-difluorophen-1-yl | 0.40 g |
| Compound I | 0.10 g |
| Tetraethylene glycol dimethacrylate | 1.50 g |
| Polyamide-acid ester ($M_w$ = 10,500) | 10.00 g |

The solution is filtered down to 0.8 μm and then whirler-coated for 15 seconds at 2,800 rpm onto white ceramic platelets of 63×63 mm size, which have been treated beforehand with γ-aminopropyltriethoxysilane as an adhesion promoter. The platelets are dried for 1 hour at 70° C. and then exposed in vacuum contact by means of a mask-adjusting and exposure machine, the USAF 1951 test pattern from Itek being used. Exposure is carried out at a light energy of 110 mJ/cm$^2$, (relative to the 400 nm light probe from Optical Associates Inc.) and development is carried out for 45 seconds by spraying with a 1:1 mixture of 4-butyrolactone and xylene. This gives highly resolved relief structures of 18.5 μm layer thickness, the image element 4.6 (17.5 μm wide grooves) still being resolved to such an extent that the underlying porous ceramic surface is laid bare.

Exposure through the corresponding USAF 1951 test pattern, which produces isolated ridges, at an exposure energy of 154 mJ/cm$^2$ gives, after a developing time of 30 seconds, highly resolved relief structures of 18.5 μm layer thickness, which show a clearly defined, downward-tapering conical profile (i.e. a negative edge angle) in the scanning electron microscope.

EXAMPLE 2

A photosensitive solution is prepared according to the following formulation, using a polyamide-acid ester corresponding to EP-A No. 119,162, Example 7:

| | |
|---|---:|
| N-Methylpyrrolidone (NMP) | 41.79 g |
| Di-π-methylcyclopentadienyl-Ti-bis-Pentafluorophenyl | 1.40 g |
| Compound II | 0.32 g |
| Tetraethylene glycol dimethacrylate | 15.00 g |

| | |
|---|---|
| Polyamide-acid ester ($\overline{M}_w$ = 10,500) | 40.00 g |

The solution is filtered down to 0.65 μm and then whirler-coated for 20 seconds at 1,400 rpm onto white ceramic platelets of 63×63 mm size, which have been treated beforehand with γ-aminopropyltriethoxysilane as an adhesion promoter. The platelets are dried for 35 minutes at 80° C. and then exposed in vacuum contact by means of a mask-adjusting and exposure machine, the USAF 1951 test pattern from Itek being used. Exposure is carried out at a light energy of 75 mJ/cm² (relative to the 400 nm light probe from Optical Associates Inc.), and the image is then developed for 35 seconds in a spray developer by spraying with a 1:1 (by volume) mixture of 4-butyrolactone and xylene, a fine-mist nozzle being used, and this is followed by a 5 seconds rinsing cycle with xylene. This gives relief structures of 32 μm layer thickness, the image element 3.1 (62.5 μm wide grooves) still being resolved to such an extent that the underlying porous ceramic surface is laid bare.

EXAMPLE 3

EXAMPLE 4

A solution consisting of

| | |
|---|---|
| Methoxypropyl acetate | 10.441 g |
| Copolymer of styrene and maleic anhydride (Monsanto Scripset ® 550) | 2.059 g |
| Trimethylolpropane triacrylate | 2.206 g |
| Polyethylene glycol-200 diacrylate | 0.294 g |
| Di-π-methylcyclopentadienyl-Ti-bis-2,6-difluorophen-1-yl | 0.114 g |
| | 0.055 g |

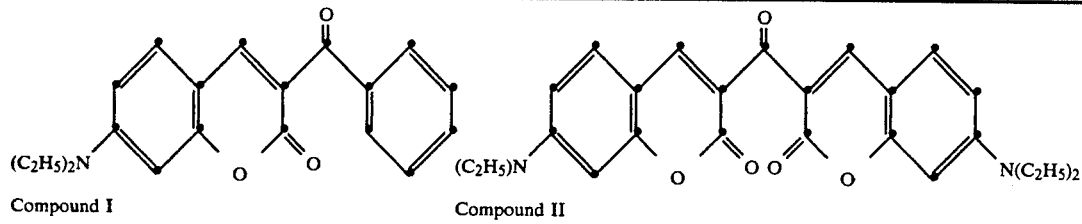

Compound I

Compound II

| Photosensitive solutions are prepared from | |
|---|---|
| N-Methylpyrrolidone (NMP) | 13.588 g |
| Di-π-methylcyclopentadienyl-Ti-bis-2,6-difluorophen-1-yl | 0.245 g |
| Tetraethylene glycol dimethacrylate | 1.05 g |
| Polyamide-acid ester ($M_w$ = 10,500; Example 7 of EP-A 119,162) | 7.00 g | in each case by means of varying additions of compounds I and II, and the coatings prepared therefrom are compared with respect to their photo sensitivity in the following way:

The filtered solutions are each whirler-coated for 25 seconds at 5,100 rpm onto silicon wafers pretreated with γ-aminopropyltriethoxysilane, 2 μm thick coatings being obtained in each case after drying (80° C., 30 minutes). Exposure is carried out using a mask-adjusting and exposure machine, both a test mask with fine structures and a mask with grey step wedges being used simultaneously. After development by spraying with a 1:2 (by volume) mixture of 4-butyrolactone and xylene, the following relative sensitivities are found, as a function of the added quantities of compounds I and II:

| Quantity added [%] relative to polyamide-ester | | |
|---|---|---|
| Compound I | Compound II | Relative sensitivity |
| — | — | 100% |
| 1.0 | — | 304% |
| 2.0 | — | 388% |
| — | 1.0 | 210% |
| — | 2.0 | 278% | is filtered down to 0.45 μm and whirler-coated for 10 seconds at 900 rpm onto white ceramic platelets of 63×63 mm size, after the platelets have been pretreated with γ-aminopropyltriethoxysilane as an adhesion promoter. The platelets are dried for 10 minutes at 100° C. on a hotplate and then whirler-coated at 4,000 rpm with a solution of

| | |
|---|---|
| Polyvinyl alcohol (Mowiol ® 4-88, Hoechst) | 12.00 g |
| Triton ® X-100 | 0.12 g |
| Deionized water | 88.00 g. |

After renewed drying at 80° C. (5 minutes), they are exposed at 12.4 mJ/cm² through a USAF 1951 test pattern, the polyvinyl alcohol layer is washed off with water for 2 minutes, and development is then carried out for 30 seconds in a solution composed of

| | |
|---|---|
| $Na_2SiO_3.5H_2O$ | 37.5 g |
| Antarox ®-CO-630 | 1.0 g |
| Deionized water | 1,000.0 g | with the aid of ultrasonics. This gives relief structures of 5 μm layer thickness (isolated lines), the image element 3.3 (49.5 μm wide lines) still being resolved.

What is claimed is:
1. A composition comprising
(a) a titanocene photoinitiator of the formula I

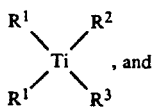 (I)

, and (b) a 3-ketocoumarin of the formula II

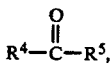 (II)

in which both $R^1$ independently of one another are unsubstituted or $C_1$–$C_6$alkyl- or $C_1$–$C_6$alkoxy-substituted cyclopentadienyl$^\ominus$, indenyl$^\ominus$ or 4,5,6,7-tetrahydroindenyl$^\ominus$ or together are a radical of the formula III

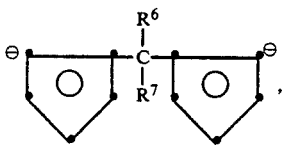 (III)

$R^6$ and $R^7$ independently of one another being hydrogen or methyl, $R^2$ is a 6-membered carbocyclic aromatic ring or a 5-membered or 6-membered heterocyclic aromatic ring, which in at least one of the two ortho-positions relative to the metal-carbon bond is substituted by a fluorine atom or by a —$CF_2R$ group, R being a fluorine atom or methyl, $R^3$ is as defined for $R^2$ or, additionally, can be halogen, cyanate, thiocyanate, azide or cyanide, —$OR^8$ or —$SR^9$, $R^8$ being hydrogen, $C_1$–$C_6$alkyl, phenyl, acetyl or trifluoroacetyl and $R^9$ being $C_1$–$C_6$alkyl or phenyl, or $R^2$ and $R^3$ together form a radical of the formula IV

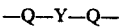 (IV), in which Q is a 6-membered carbocyclic aromatic radical or a 5-membered or 6-membered heterocyclic aromatic radical, the two bonds each being in the ortho-position relative to the bridge Y and each meta-position relative to the bridge Y being substituted by a fluorine atom or a —$CF_2R$ group, and Y is a direct bond, —O—, —S—, —$SO_2$—, —CO—, —$CH_2$— or —$C(CH_3)_2$—, $R^4$ is a radical of the formula V

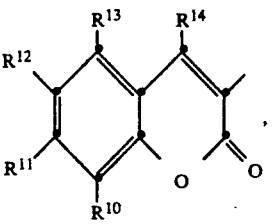 (V)

$R^5$ is $C_1$–$C_{20}$alkyl, cycloalkyl having 5–7 ring carbon atoms, phenyl or naphthyl which are unsubstituted or substituted by one to three $C_1$–$C_6$-alkyl groups, $C_1$–$C_6$alkoxy groups or halogen atoms or by one diphenylamino or $C_1$–$C_6$dialkylamino group, or is $C_7$–$C_9$aralkyl, a radical —(CH=CH)$_a$—$C_6H_5$ or a radical of the formula V, a is 1 or 2, and $R^{10}$, $R^{11}$, $R^{12}$, $R^{13}$ and $R^{14}$ independently of one another are hydrogen, $C_1$–$C_6$alkyl, $C_1$–$C_6$alkoxy, phenyl, tolyl, xylyl or benzyl and $R^{11}$ can additionally also be a group —$NR^{15}R^{16}$ or —$OR^{15}$, wherein $R^{15}$ and $R^{16}$ independently of one another are hydrogen or $C_1$–$C_6$alkyl, it also being possible for two or three of the radicals $R^{10}$, $R^{11}$, $R^{12}$ and $R^{13}$ together with the ring carbon atoms, to which they are attached, to form a fused ring having 5 or 6 ring atoms or a fused ring system having 5-membered or 6-membered rings.

2. A composition according to claim 1, wherein both $R^1$ independently of one another are cyclopentadienyl which is unsubstituted or substituted by one or two methyl groups, $R^2$ and $R^3$ independently of one another are a radical of the formula VI

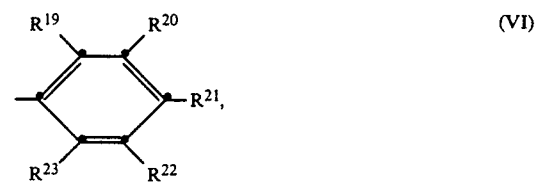 (VI)

in which $R^{19}$ is a fluorine atom or a —$CF_2R$ group and $R^{20}$, $R^{21}$, $R^{22}$ and $R^{23}$ independently of one another are a fluorine atom, a —$CF_2R$ group, hydrogen, $C_1$–$C_6$alkyl or $C_1$–$C_6$alkoxy or $R^2$ and $R^3$ together form a group of the formula IVa

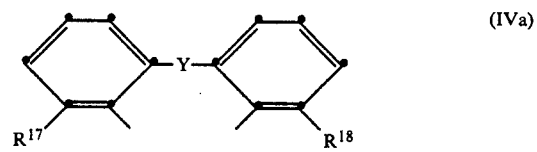 (IVa)

in which $R^{17}$ and $R^{18}$ independently of one another are a fluorine atom or a —$CF_2R$ group and Y is as defined in claim 1, or $R^3$ additionally can be a chlorine atom or a cyanide group.

3. A composition according to claim 1, wherein $R^1$ and $R^2$ independently of one another are cyclopentadienyl or methylcyclopentadienyl, and R3 and R4 independently of one another are a radical of the formula VII

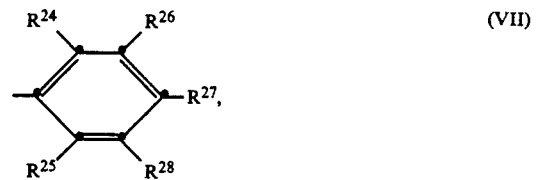 (VII)

in which $R^{24}$ and $R^{25}$ independently of one another are a fluorine atom or a —$CF_3$ group and $R^{26}$, $R^{27}$ and $R^{28}$ independently of one another are hydrogen, a fluorine atom or a —$CF_3$ group.

4. A composition according to claim 1, wherein the groups $R^{10}$, $R^{12}$ and $R^{13}$ are hydrogen, $R^{11}$ is hydrogen, —$NR^{15}R^{16}$ or —$OR^{15}$, $R^{14}$ is hydrogen or methyl and $R^5$ is $C_1$–$C_{12}$alkyl, cyclohexyl, phenyl, tolyl or benzyl.

5. A composition according to claim 1, wherein the groups $R^{10}$, $R^{12}$, $R^{13}$ and $R^{14}$ are hydrogen, $R^{11}$ is —NR$^{15}$R$^{16}$ and R$^5$ is a radical of the formula V or phenyl.

6. A composition according to claim 5, wherein R$^{11}$ is —N(C$_1$-C$_6$-alkyl)$_2$.

7. A composition according to claim 6, wherein R$^{11}$ is —N(C$_2$H$_5$)$_2$.

8. A composition comprising the components (a) and (b) according to claim 1 and, as a component (c), ethylenically unsaturated monomers or prepolymers.

9. A composition according to claim 8, containing, as component (c), a polymer precursor which has identical or different recurring structural units of the formula VIII

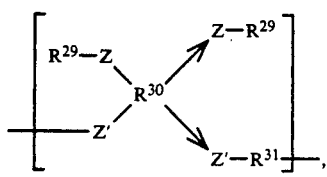
(VIII)

and reacts on heating to give a thermally stable ring structure, in which formula R$^{29}$ is a radical having a photopolymerizable olefinic double bond, R$^{30}$ is a tetravalent aromatic radical after removal of the four functional groups, two functional groups in each case being adjacent and the arrows representing structural isomerism, R$^{31}$ is a divalent aliphatic, cycloaliphatic or mononuclear or polynuclear aromatic radical, it being possible for aromatic radicals R$^{31}$ to carry one of the groups —CONH$_2$ or —COOH in the ortho-position relative to the bond Z', the Z are a covalent or ionic bond element and the Z' are a covalent bond element, with the proviso that, on heating of the photopolymerizable composition, Z and Z' alone, or together with —CONH$_2$ or —COOH groups contained in R$^{31}$, give a thermally stable ring structure, with elimination of R$^{29}$.

10. A composition according to claim 9, wherein component (c) is a polymer precursor having recurring structural elements of the formula VIIIa

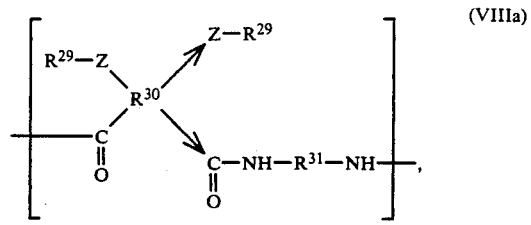
(VIIIa)

in which R$^{30}$ is the tetravalent radical of an aromatic tetracarboxylic acid after the removal of four carboxyl groups and R$^{31}$, R$^{29}$ and Z are as defined in claim 9.

11. A composition according to claim 9, wherein component (c) is a polymer precursor having recurring structural elements of the formula VIIIb

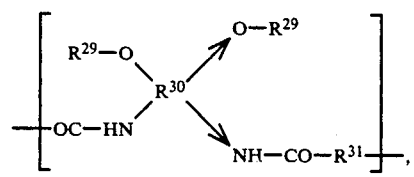
(VIIIb)

in which R$^{30}$ is the radical of 3,3'-dihydroxybenzidine, the R$^{31}$ radicals in the individual recurring structural elements independently of one another are the radical of isophthalic acid or of 4,4'-benzophenonedicarboxylic acid and R$^{29}$ is as defined in claim 9.

12. A composition according to claim 9, wherein component (c) is a polymer precursor having recurring structural elements of the formula VIIIc

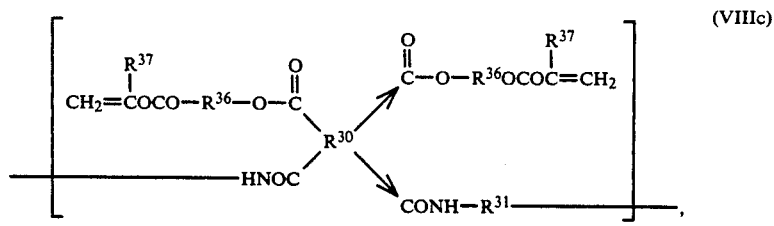
(VIIIc)

in which R$^{30}$ is the radical of pyromellitic dianhydride, a benzophenonetetracarboxylic dianhydride or a mixture of such radicals, the R$^{31}$ radicals in the individual recurring structural elements independently of one another are 1,3- or 1,4-phenylene, the radical of 4,4'-diaminodiphenyl ether, of 4,4'-diaminodiphenylmethane, of 2,2-bis-(4-aminophenyl)-hexafluoropropane, of 4,4'-diamino-3-carbonamidodiphenyl ether or of 4,4'-diamino-3,3'-bis-carbonamidodiphenyl, R$^{36}$ is —CH$_2$CH$_2$— or —CH$_2$CH(OH)CH$_2$— and R$^{37}$ is a hydrogen atom or methyl.

13. A composition according to claim 9, wherein component (c) is a polymer precursor having recurring structural elements of the formula VIIId

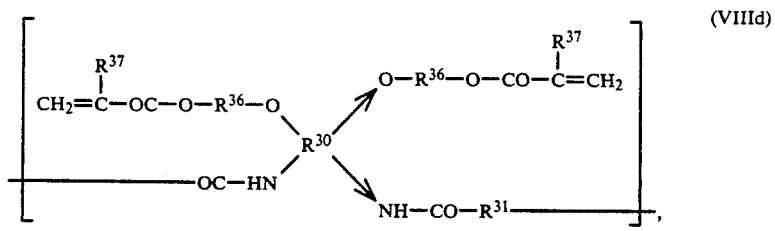

(VIIId)

in which $R^{30}$ is the radical of 3,3'-dihydroxybenzidine, the $R^{31}$ radicals in the individual recurring structural elements independently of one another are 1,3-phenylene or the radical of 4,4'-benzophenonedicarboxylic acid, $R^{36}$ is $-CH_2CH_2-$, $-CH_2CH_2CH_2-$ or $CH_2CH(OH)-CH_2-$ and $R^{37}$ is a hydrogen atom or methyl.

14. A composition according to claim 9, additionally containing, as a component (d), an acrylic acid ester, methacrylic acid ester, allyl ether or allyl ester or partial esters of these acids with a polyol.

15. A process for producing images or protective layers, comprising the steps of
  (i) applying a layer of a composition according to claim 14 to a substrate,
  (ii) imagewise exposure of the system,
  (iii) with or without a thermal pretreatment, in order to pre-harden the exposed areas,
  (iv) developing the system and
  (v) thermally cyclizing the component (c).

16. The images or protective layers obtainable by the process according to claim 15.

17. A process for producing images on substrates, which are strongly scattering or strongly reflecting, by
  (i) applying the photopolymerizable composition containing the components (a), (b), and (c), according to claim 8 to the substrate,
  (ii) imagewise exposure of the system,
  (iii) with or without a thermal pretreatment, in order to pre-harden the exposed areas,
  (iv) developing the system and
  (v) thermally cyclizing the component (c).

18. A process according to claim 17 wherein the composition of step (i) also contains as component (d) an acrylic acid ester, methacrylic acid ester, allyl ether or allyl ester or partial esters of these acids with a polyol.

* * * * *